(12) United States Patent
Kim

(10) Patent No.: US 6,869,835 B2
(45) Date of Patent: Mar. 22, 2005

(54) METHOD OF FORMING MOS TRANSISTOR

(75) Inventor: Myoung-soo Kim, Suwon (KR)

(73) Assignee: Samsung Electronics, Co., LTD, Suwon (KR)

( * ) Notice: Subject to any disclaimer, the term of this patent is extended or adjusted under 35 U.S.C. 154(b) by 0 days.

(21) Appl. No.: 10/455,600

(22) Filed: Jun. 5, 2003

(65) Prior Publication Data
US 2004/0048427 A1 Mar. 11, 2004

(30) Foreign Application Priority Data
Sep. 11, 2002 (KR) .................................. 10-2002-0054905

(51) Int. Cl.[7] .......................................... H01L 21/336
(52) U.S. Cl. ........................................ 438/197; 438/258
(58) Field of Search ........................................ 438/197

(56) References Cited

U.S. PATENT DOCUMENTS 5,449,629 A * 9/1995 Kajita ........................ 438/258
5,497,018 A * 3/1996 Kajita ........................ 257/316
6,238,967 B1 * 5/2001 Shiho et al. ................. 438/244
6,303,455 B1 * 10/2001 Hou et al. ................... 438/381
6,391,755 B2 * 5/2002 Ma et al. .................... 438/593

* cited by examiner

Primary Examiner—David Nelms
Assistant Examiner—Thao P. Le
(74) Attorney, Agent, or Firm—F. Chau & Associates, LLC

(57) ABSTRACT

Methods of simultaneously forming MOS transistors and a capacitor on a substrate having gate insulation layers of varying thicknesses. A method includes forming field regions in a substrate to define a first transistor region, a capacitor region, and a second transistor region, forming a first gate stack in the first transistor region and a lower electrode in the capacitor region, and forming an upper electrode on the lower electrode with a dielectric layer interposed therebetween and a second gate stack in the second transistor region.

13 Claims, 14 Drawing Sheets

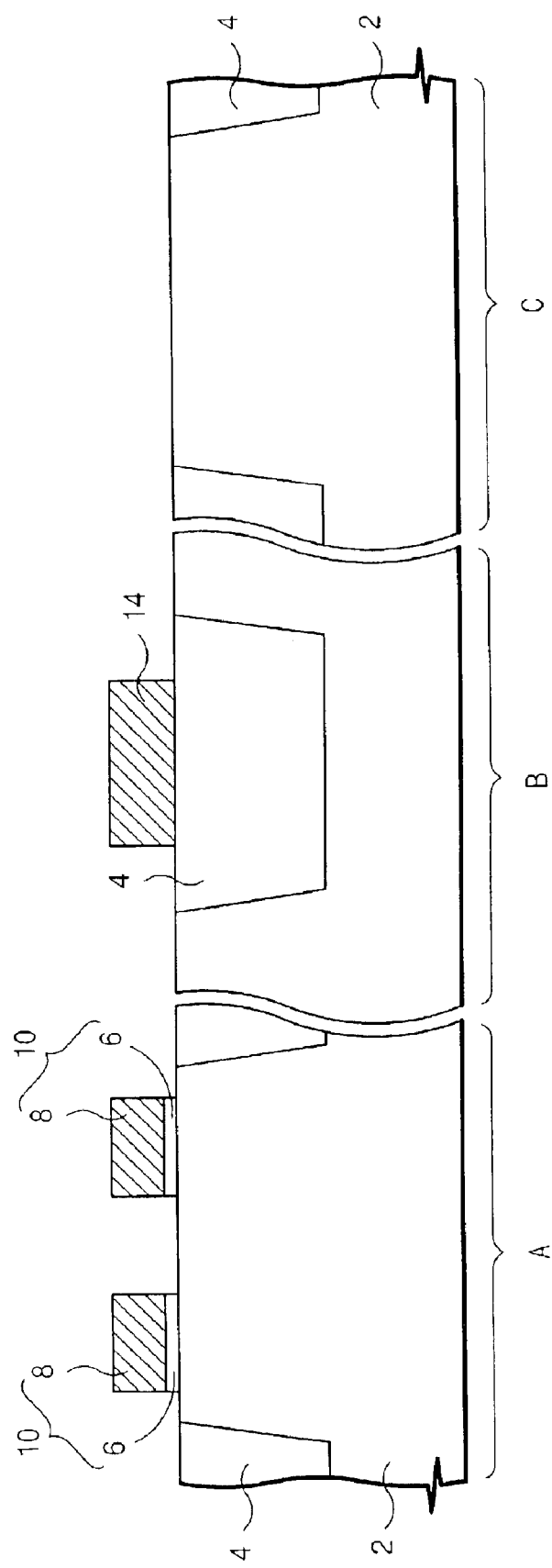

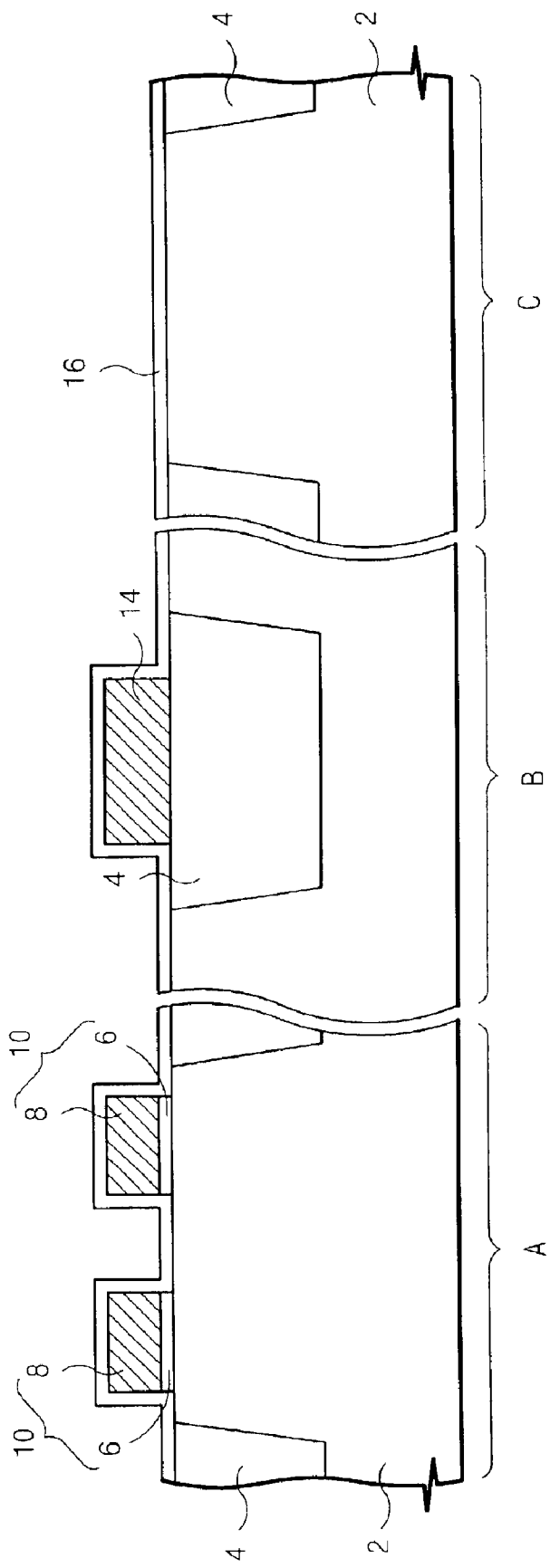

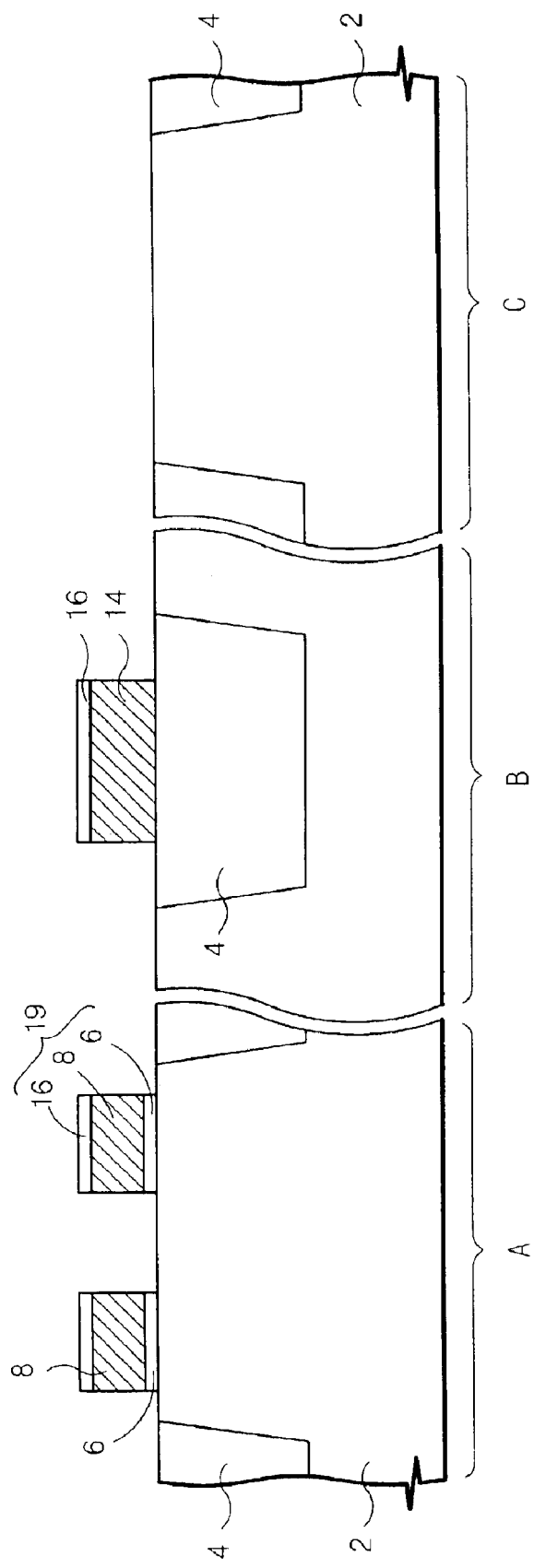

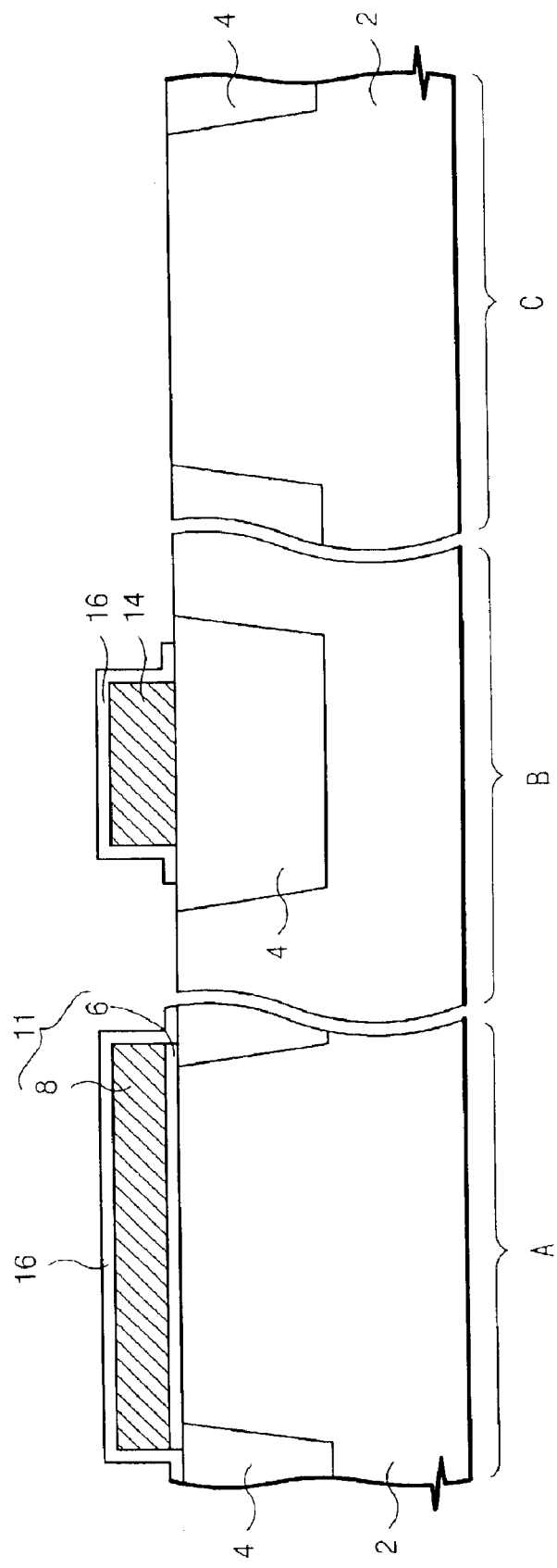

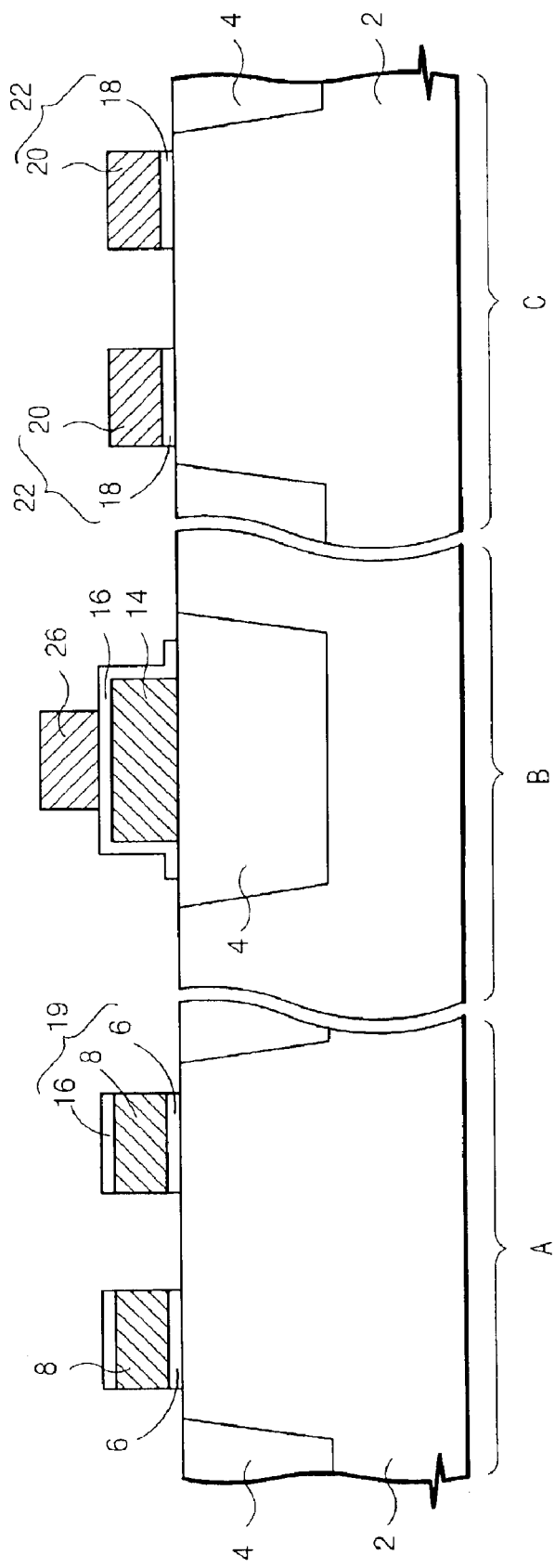

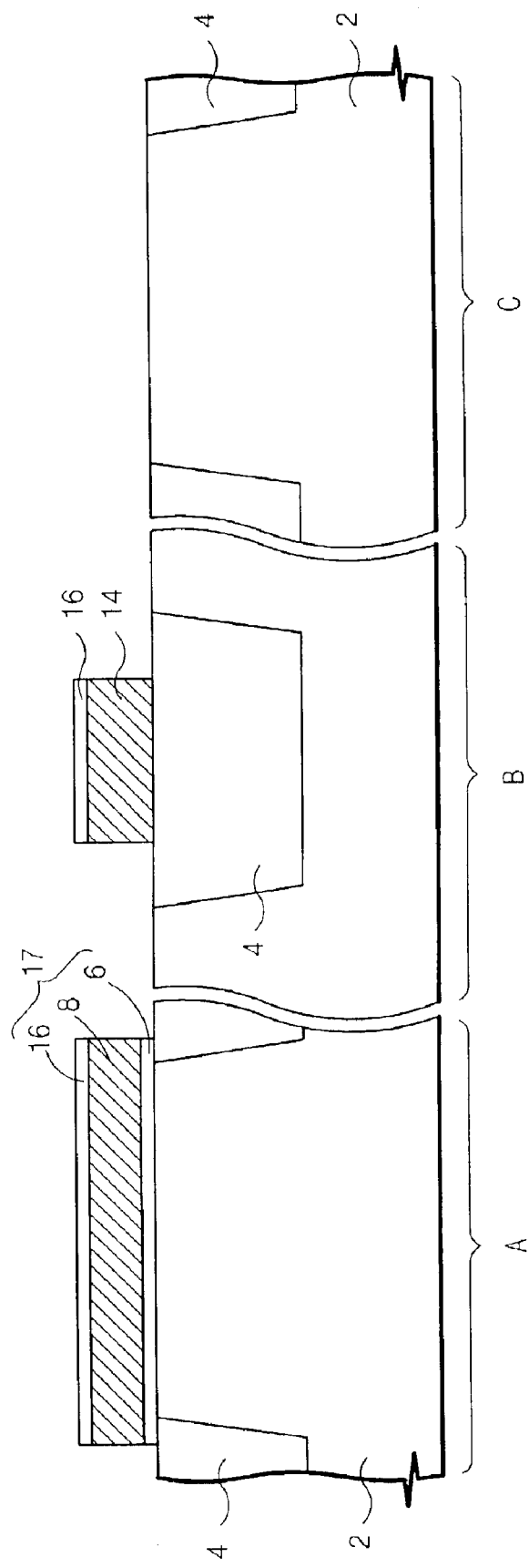

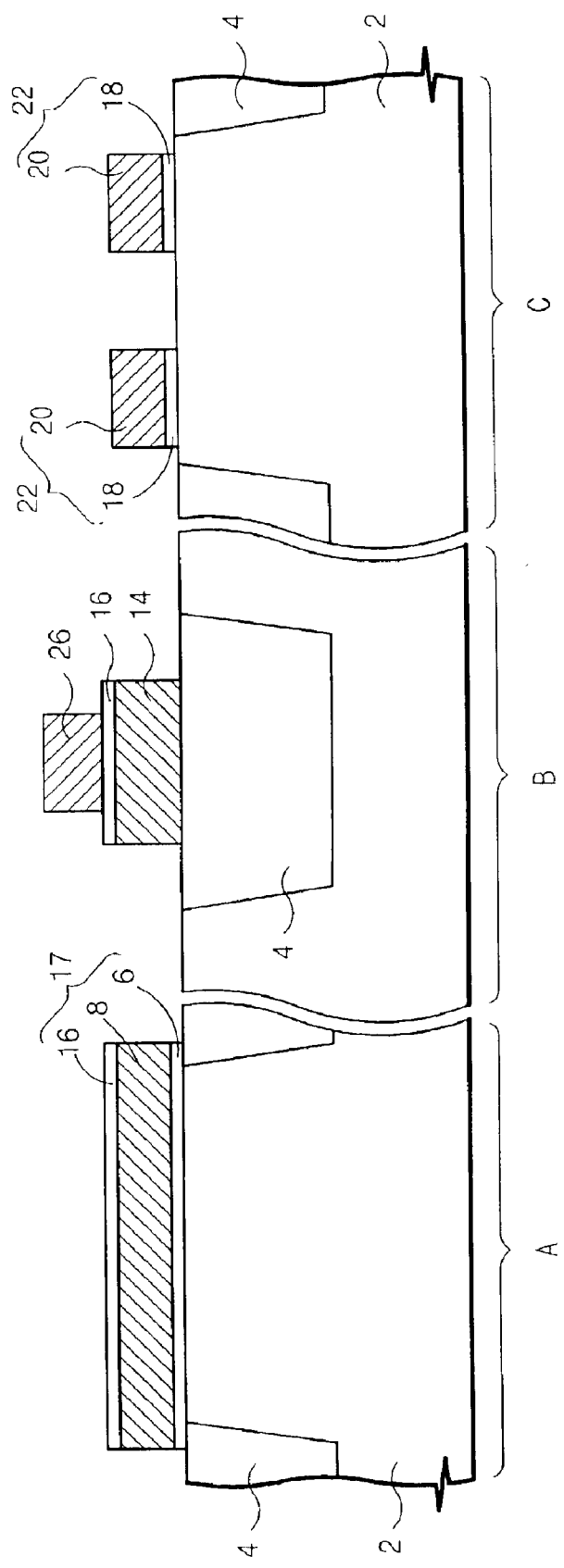

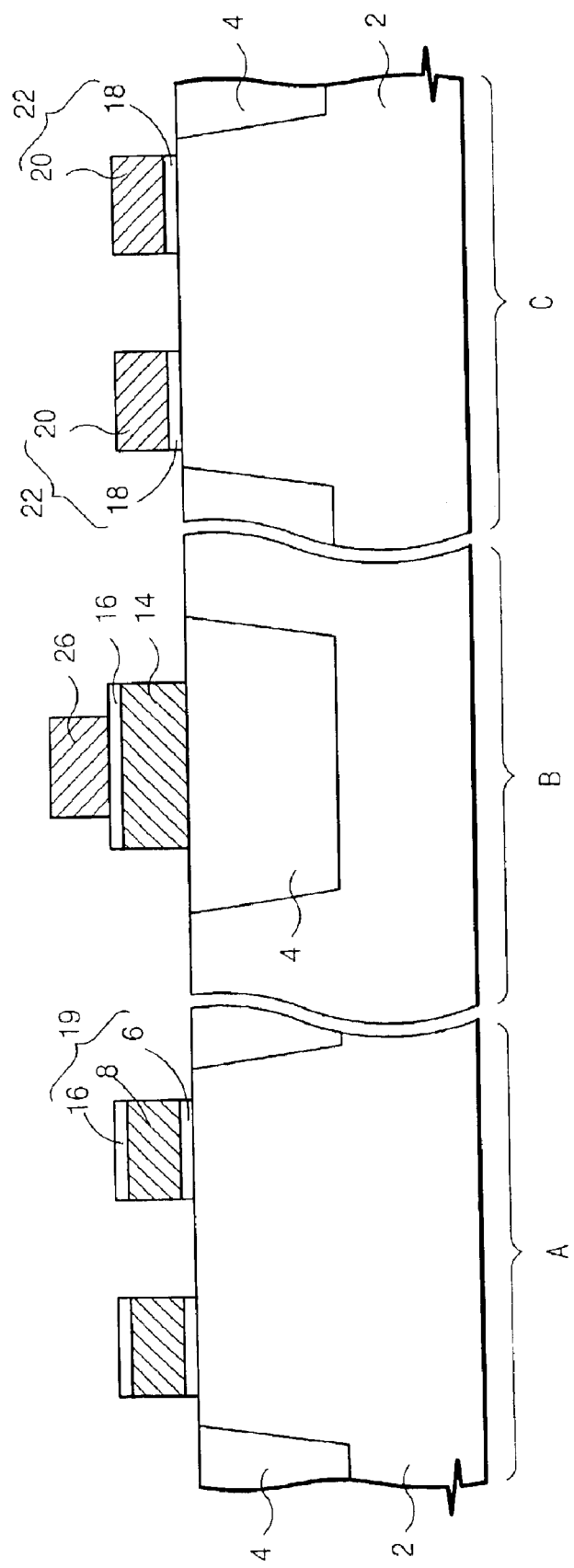

METHOD OF FORMING MOS TRANSISTOR

BACKGROUND OF THE INVENTION

1. Field of the Invention

The present invention relates generally to methods of forming MOS transistors, and more particularly to methods of simultaneously forming MOS transistors and a capacitor, an electrically erasable and programmable read only memory or a resistance on a substrate having gate insulation layers of varying thicknesses.

2. Discussion of Related Art

In a semiconductor integrated circuit (IC), electrical devices such as a transistor, a capacitor and a resistance are integrated into a chip. Therefore, methods for effectively integrating these electrical devices into a chip have been developed. For example, a method of simultaneously forming a plate electrode of a poly-insulation-poly (PIP) capacitor and a gate electrode of a MOS transistor is taught in U.S. Pat. No. 6,303,455, entitled "Method of fabricating capacitor".

There have been extensive studies on simultaneously employing logic technologies for processing data (e.g., CPU technologies) and memory technologies for storing data. In addition, transistor technologies have been adapted to the logic and memory technologies. The current supplying ability of a transistor, and its low leakage current and high breakdown voltage characteristics are important in the memory technology. Therefore, a novel method to effectively embody MOS transistors having insulation layers of varying thicknesses in a single chip is needed.

SUMMARY OF THE INVENTION

An embodiment of the present invention provides a method of forming MOS transistors having insulation layers of varying thicknesses from each other.

According to another embodiment of the present invention, a method of forming a semiconductor device includes forming field regions in a substrate to define a first transistor region, a capacitor region, and a second transistor region. Simultaneously, a first gate stack is formed in the first transistor region and a lower electrode is formed in the capacitor region. Then, an upper electrode is formed on the lower electrode with a dielectric layer interposed therebetween and a second gate stack is simultaneously formed in the second transistor region.

According to another embodiment of the present invention, a method of fabricating a semiconductor device comprises forming field regions in a substrate to define a first transistor region, a capacitor region and a second transistor region. Simultaneously, a gate pattern is formed in the first transistor region and a lower electrode is formed in the capacitor region. Next, an upper electrode is formed on the lower electrode with a dielectric layer interposed therebetween and a second gate stack is simultaneously formed in the second transistor region. Then, the gate pattern is patterned to form a first gate stack, wherein forming the upper electrode with dielectric layer interposed thereunder and the second gate stack comprises forming a dielectric layer on the lower electrode, forming a second insulation layer and a second conductive layer, and patterning the second conductive layer and the second insulation layer to form the upper electrode and the second gate stack.

BRIEF DESCRIPTION OF THE DRAWINGS

FIGS. 1A–1D are cross-sectional views showing steps of forming MOS transistors and a capacitor in accordance with a first exemplary embodiment of the present invention.

FIGS. 2A–2B are cross-sectional views showing steps of forming MOS transistors and a capacitor in accordance with a second exemplary embodiment of the present invention.

FIGS. 3A–3E are cross-sectional views showing steps of forming MOS transistors and a capacitor in accordance with a third exemplary embodiment of the present invention.

FIGS. 4A–4C are cross-sectional views showing steps of forming MOS transistors and a capacitor in accordance with a fourth exemplary embodiment of the present invention.

DETAILED DESCRIPTION OF PREFERRED EMBODIMENTS

Figure 1C:
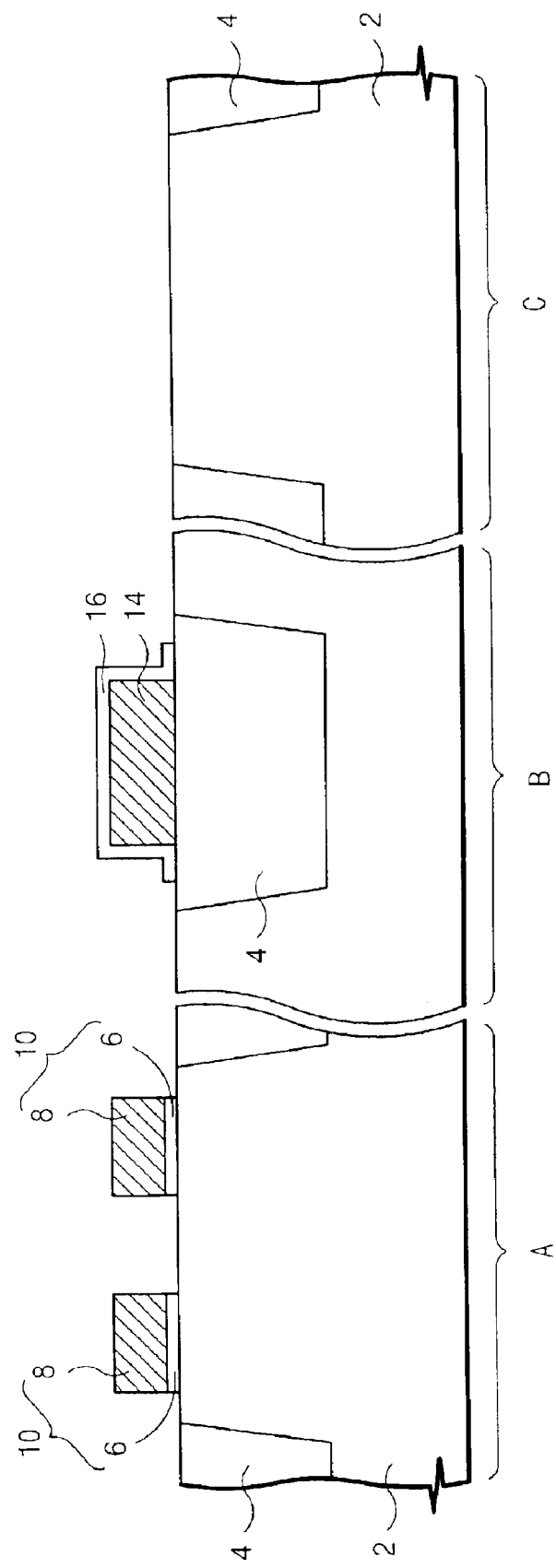

The present invention will now be described more fully hereinafter with reference to the accompanying drawings, in which exemplary embodiments of the invention are shown.

A first transistor is formed in a region "A" and a capacitor is formed in a region "B." A second transistor is formed in a region "C." In any of exemplary embodiments, the capacitor is formed in the region "B," but an electrically erasable and programmable read only memory (EEPROM) or a resistance may be formed in region "B" as well. For example, a lower electrode of the capacitor corresponds to a floating gate of the EEPROM and a dielectric layer to inter-gate dielectric, an upper electrode of the capacitor to a control gate of the EEPROM. In addition, regions "A," "B" and "C" of the drawings include two transistors, one capacitor and two transistors. This is for the convenience of explanation.

FIGS. 1A–1D are cross-sectional views showing steps of forming MOS transistors in accordance with a first exemplary embodiment of the present invention.

Referring to FIG. 1A, field regions 4 are formed to define at least one active region in a substrate 2. In FIG. 1A, a predetermined region of the substrate 2 is selectively etched to form trenches. Then, the trenches are filled with an insulation material and polished using a chemical mechanical polishing to form the field regions 4. A first insulation layer and a first conductive layer are formed on a substrate including the field regions 4. A photolithographic process is performed to form a first gate stack 10 comprising a first gate insulation layer 6 and a first gate electrode 8 in region "A." Simultaneously, a lower electrode 14 of a capacitor is formed in region "B." The first gate insulation layer 6 is preferably formed of silicon oxide and the first conductive layer is preferably formed of polysilicon or any like material.

Referring to FIG. 1B, a dielectric layer 16 is formed on an entire surface of a substrate 2 including the first gate stack 10 and the lower electrode 14. The dielectric layer 16 is a material selected from the group consisting of silicon oxide, silicon nitride, oxide-nitride-oxide (ONO), tantalum oxide, barium-strontium-titanium (Ba—Sr—Ti) oxide, zirconium (Zr) oxide, hafnium (Hf) oxide, plumbum-zinc-titanium (PbZn—Ti) oxide, strontium-bismuth-tantalum (Sr—Bi—Ta) oxide, and any combination thereof.

Referring to FIG. 1C, the dielectric layer 16 is patterned such that the dielectric layer 16 remains on the lower electrode 14 in region "B."

Figure 1D:
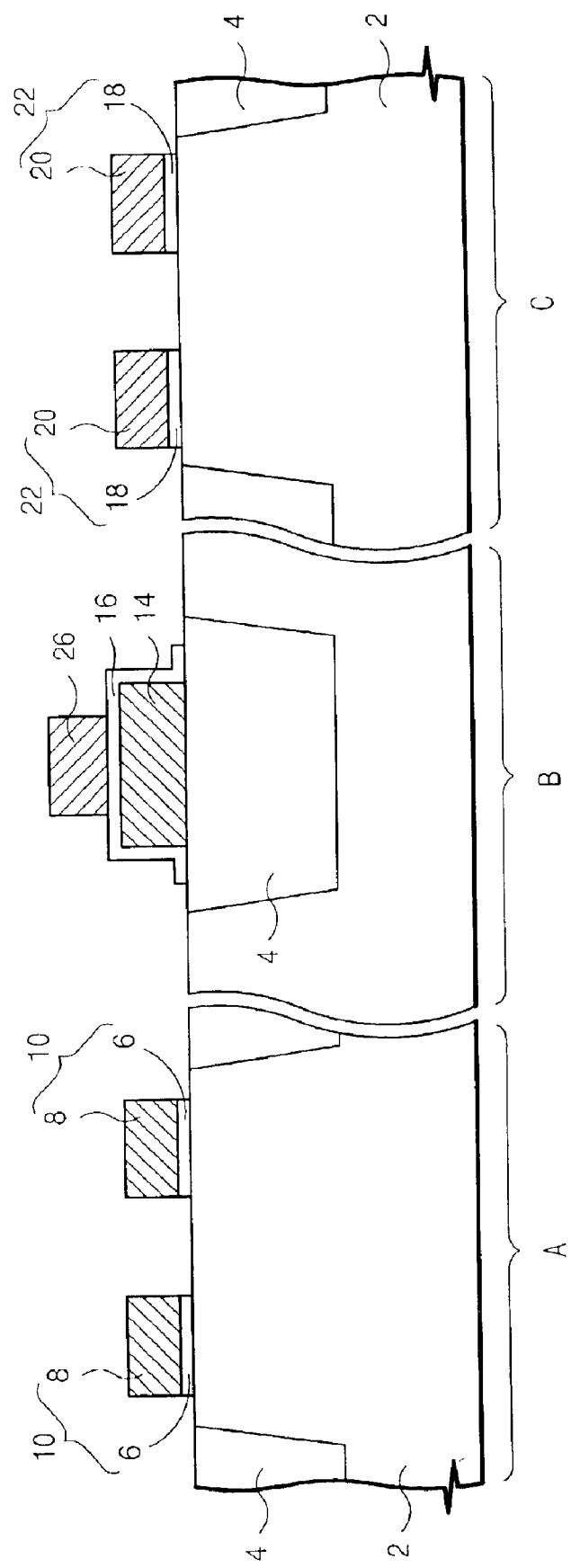

Referring to FIG. 1D, a second insulation layer and a second conductive layer are sequentially stacked on an entire surface of the substrate 2. The second conductive layer and the second insulation layer are patterned by a photolithographic process to form a second gate stack 22 in region "C" and an upper electrode 26 of the capacitor in region "B." The second gate stack 22 comprises a second gate insulation layer 18 and a second gate electrode 20. The second insulation layer 18 is formed having a different thickness than the first insulation layer 6, so that transistors in regions "A" and "C" may have different characteristics. In other words, a MOS transistor formed in region "C" can have different characteristics than a MOS transistor formed in region "A" and a capacitor formed in region "B."

Source and drain regions are formed in the substrate on opposite sides of the gate stacks 10 and 22, respectively, to complete the formation of a MOS transistor (not shown).

Figure 2B:
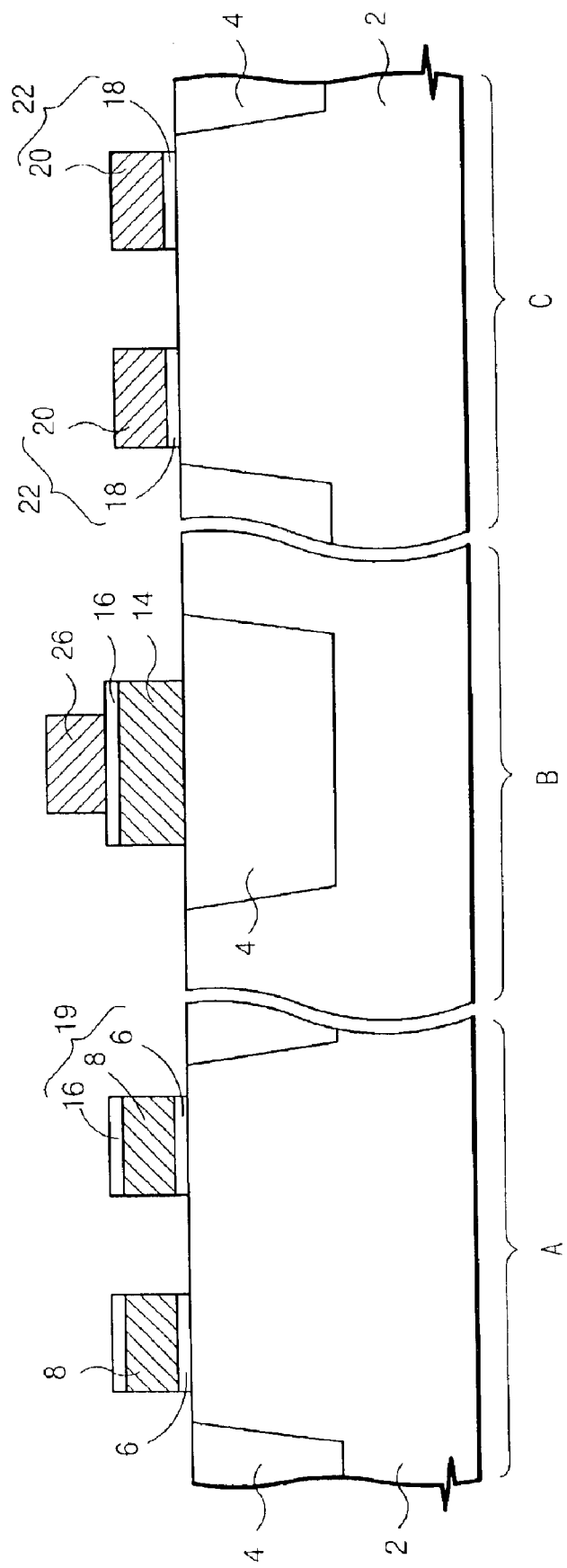

FIGS. 2A and 2B are cross-sectional views showing steps of forming MOS transistors and a capacitor in accordance with a second exemplary embodiment of the present invention.

Referring to FIG. 2A, field regions 4 are formed to define at least one active region in a substrate 2. A first insulation layer, a first conductive layer, and a dielectric layer are sequentially stacked on an entire surface of the substrate 2. The dielectric layer, the first conductive layer, and the first gate insulation layer are patterned by a photolithographic process to form a gate stack 19 in region "A." Simultaneously, a lower electrode 14 and a dielectric layer 16 of a capacitor are formed in region "B." The gate stack 19 comprises a first gate insulation layer 16, a first gate electrode 8, and a dielectric layer 16.

Referring to FIG. 2B, a second insulation layer and a second conductive layer are formed on an entire surface of the substrate. Then, the second insulating layer and the second conductive layer are patterned by a photolithographic process to form a second gate stack 22 in region "C" and an upper electrode 26 in region "B." The second gate stack 22 comprises a second gate insulation layer 18 and a second gate electrode 20. The second insulation layer 18 is formed having a different thickness than the first gate insulation layer 6. In other words, transistors in region "A" and region "C" may have different characteristics from each other.

Source and drain regions are formed in a substrate on opposite sides of the gate stacks 19 and 22, respectively, thereby completing the formation of the MOS transistors.

In the second exemplary embodiment, the gate stack 19, the lower electrode 14, and the dielectric layer 16 are patterned at the same time, thereby reducing the number photolithographic steps for forming a semiconductor device.

FIGS. 3A–3E are cross-sectional views showing steps of forming MOS transistors and a capacitor in accordance with a third exemplary embodiment.

Figure 3A:
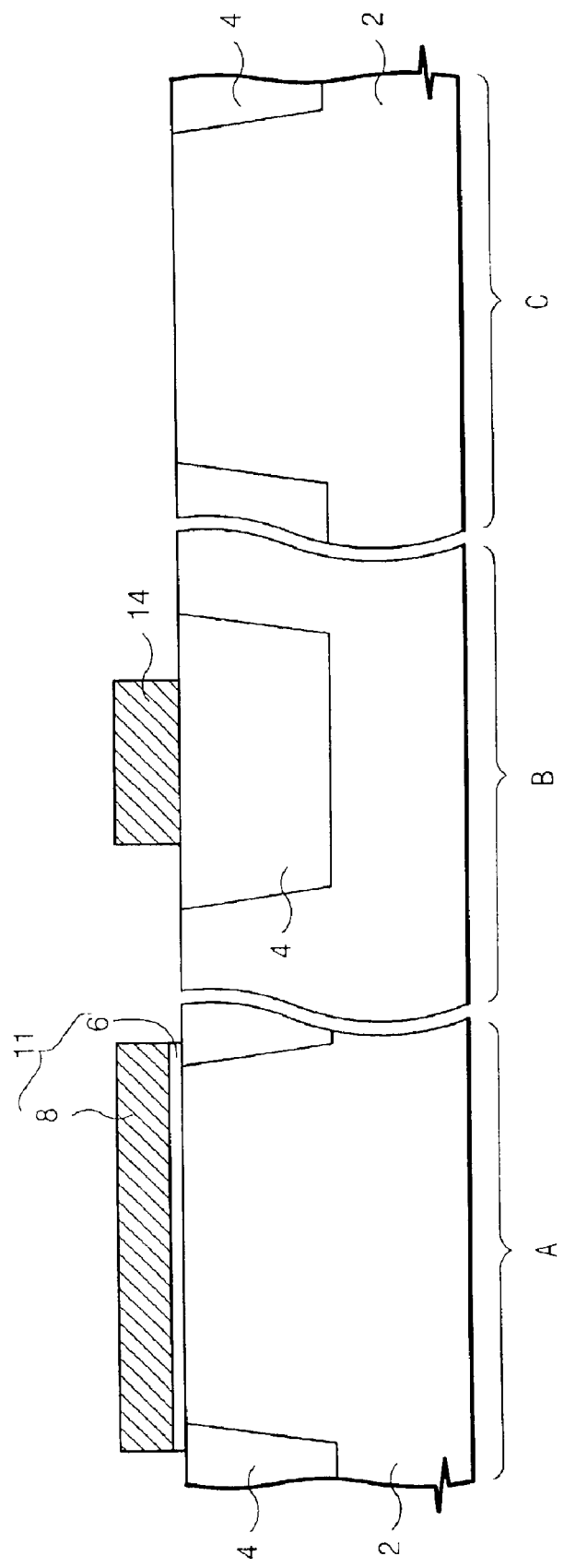

Referring to FIG. 3A, field regions 4 are formed to define at least one active region in a substrate 2. A first insulation layer and a first conductive layer are sequentially formed on the substrate 2. The first conductive layer and the first insulation layer are patterned by a photolithographic process so as to form a gate pattern 11 in a region "A" and a lower electrode 14 in a region "B." The gate pattern 11 comprises a first gate insulation layer 6 and a first gate conductive pattern 8. Preferably, edges of the gate pattern 11 overlap the field regions 4.

Figure 3B:
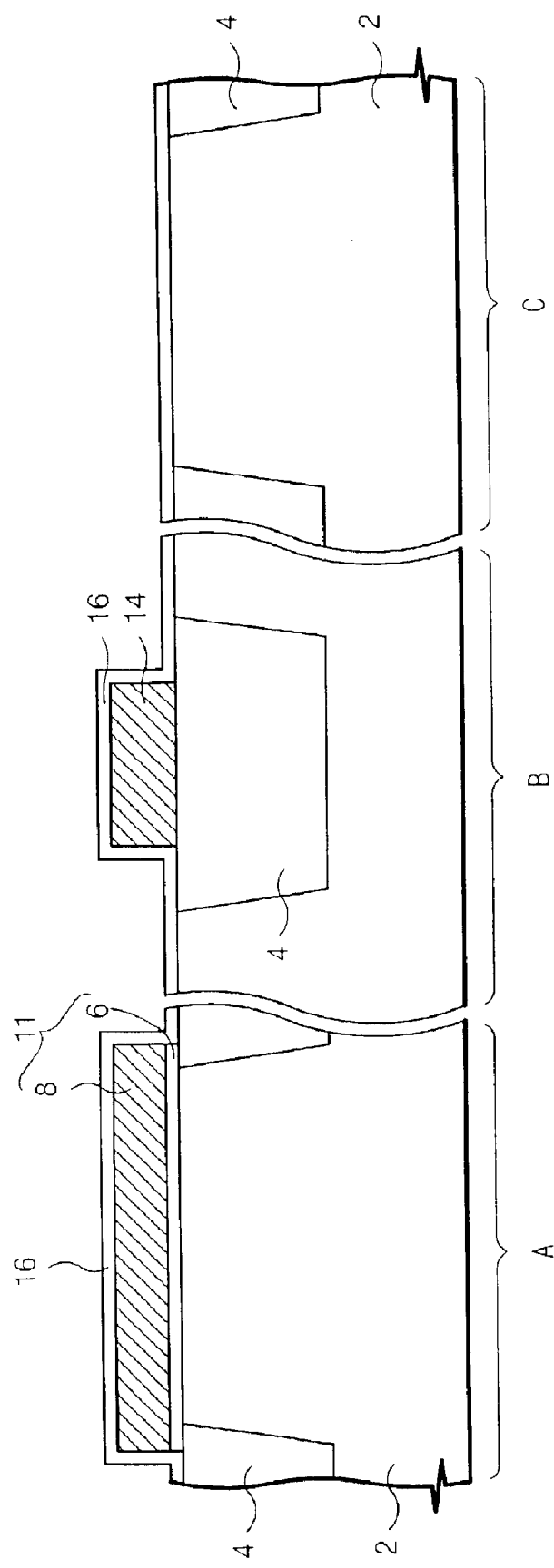

Referring to FIG. 3B, a dielectric layer 16 is formed on a substrate which includes the gate pattern 11 and the lower electrode 14.

Referring to FIG. 3C, the dielectric layer 16 is patterned by a photolithographic process such that the dielectric layer 16 remains on an entire surface of the gate pattern 11 in region "A" and the lower electrode 14 in region "B."

Figure 3D:
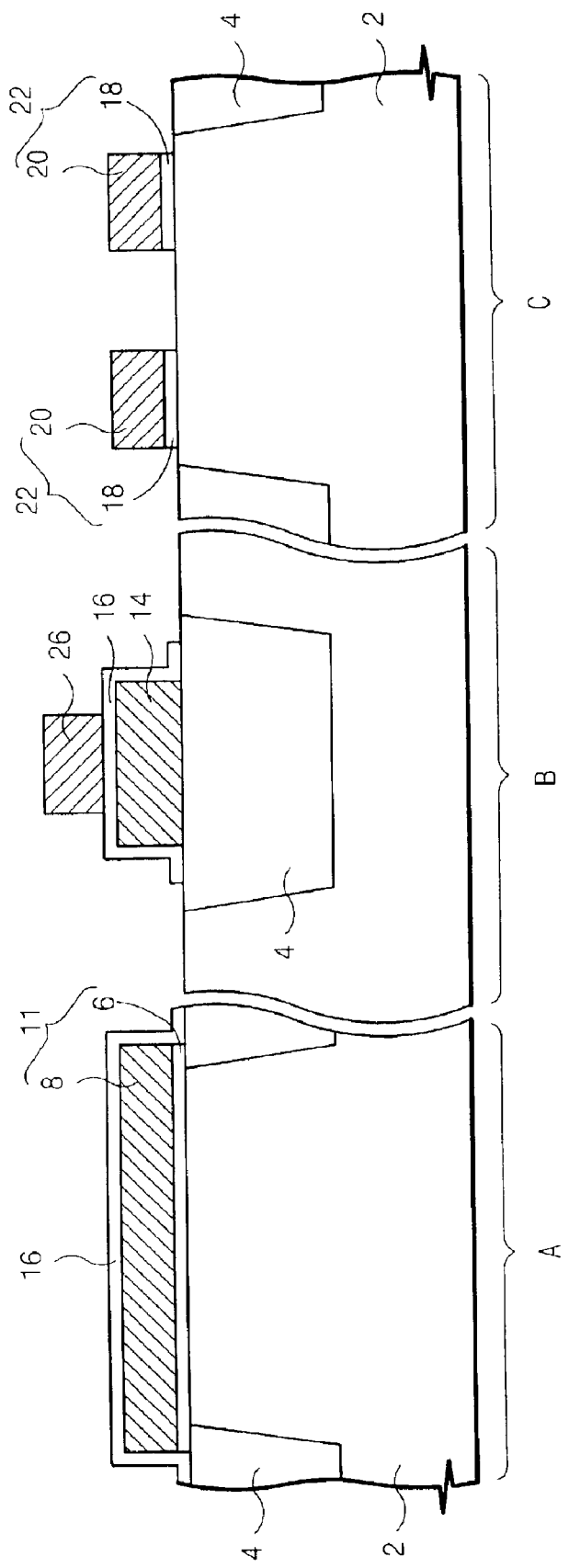

Referring to FIG. 3D, a second insulation layer and a second conductive layer are sequentially stacked on an entire surface of the substrate. The second conductive layer and the second insulation layer are patterned by a photolithographic process to form a second gate stack 22 in a region "C" and an upper electrode 26 in region "B." The second gate stack 22 comprises a second gate insulation layer 18 and a second gate electrode 20. The second gate insulation layer 18 is formed having a different thickness than the first gate insulation layer 6.

Referring to FIG. 3E, the gate pattern 11 is patterned by a photolithographic process to form a first gate stack 19 in a region "A."

Source and drain regions are formed in a substrate on opposite sides of the gate stacks 19 and 22, respectively, to complete the formation of a MOS transistor.

In the third embodiment, the dielectric layer 16 covers a top portion of the first gate stack 19 and serves as a barrier layer during a subsequent ion implantation process. For example, while boron (B) ions are implanted to form a source and a drain of a PMOS, boron penetration is prevented by the dielectric layer 16.

FIGS. 4A–4C are cross-sectional views showing steps of forming MOS transistors and a capacitor in accordance with a fourth exemplary embodiment of the present invention.

Referring to FIG. 4A, field regions 4 defining at least one active region are formed in a substrate 2. Then, a first insulation layer, a first conductive layer, and a dielectric layer are sequentially stacked on an entire surface of a substrate 2. The dielectric layer, the first conductive layer, and the first insulation layer are patterned by a photolithographic process to form a first gate pattern 17 in a region "A" and a lower electrode 14 and a dielectric layer 16 in a region "B." The first gate pattern 17 comprises a first gate insulation layer 6, a first gate electrode 8 and a dielectric layer 16.

Referring to FIG. 4B, a second insulation layer and a second conductive layer are formed on an entire surface of the substrate. Then, the second conductive layer and the second insulation layer are patterned using a photolithographic process to form a second gate stack 22 in a region "C" and an upper electrode 26 in region "B." The second gate stack 22 comprises a second gate insulation layer 18 and a second gate electrode 20. The second insulation layer 18 is formed having a different thickness than the first insulation layer 6.

Referring to FIG. 4C, the gate pattern 17 is patterned by a photolithographic process to form a first gate stack 19.

Source and drain regions (not shown) are formed in a substrate on opposite sides of the first and second gate stacks 19 and 22, respectively, to complete the formation of a MOS transistor.

In the fourth embodiment, the gate pattern 17, the lower electrode 14, and the dielectric layer 16 are simultaneously patterned, thereby reducing the number of photolithographic processes for forming semiconductor devices.

According to the embodiments of the present invention, MOS transistors including gate insulation layers having different thicknesses are formed using typical fabrication steps and structures of a capacitor, a resistance, an electrically erasable and programmable read only memory or the like.

While the present invention has been described in connection with specific and exemplary embodiments thereof, it is capable of various changes and modifications without departing from the spirit and scope of the invention.

What is claimed is:

1. A method of forming a semiconductor device comprising:

forming field regions in a substrate to define a first transistor region, a capacitor region, and a second transistor region;

forming a first gate stack in the first transistor region and a lower electrode in the capacitor region; and forming an upper electrode on the lower electrode with a dielectric layer interposed therebetween and a second gate stack in the second transistor region.

2. The method of claim 1, wherein forming the first gate stack and the lower electrode comprises:

forming a first insulation layer and a first conductive layer on the substrate; and patterning the first conductive layer and the first insulation layer to form the first gate stack and the lower electrode, and wherein forming the upper electrode with dielectric layer interposed thereunder and the second gate stack comprises:

forming a dielectric layer on the lower electrode;

forming a second insulation layer and a second conductive layer; and patterning the second conductive layer and the second insulation layer to form the upper electrode and the second gate stack.

3. The method of claim 2, wherein the first insulation layer and the second insulation layer are formed having different thicknesses from each other.

4. The method of claim 1, wherein forming the first gate stack and the lower electrode comprises:

forming a first insulation layer, a first conductive layer, and a dielectric layer on the substrate; and patterning the dielectric layer, the first conductive layer and the first insulation layer to form the first gate stack, the lower electrode and the dielectric layer, and wherein said step of forming the upper electrode and the second gate stack comprises:

forming a second insulation layer and a second conductive layer on the substrate; and patterning the second conductive layer and the second insulation layer to form the upper electrode and the second gate stack.

5. The method of claim 4, wherein the first insulation layer and the second insulation layer are formed having different thicknesses from each other.

6. The method of claim 1, wherein the dielectric layer is a material selected from the group consisting of silicon oxide, silicon nitride, oxide-nitride-oxide, tantalum oxide, barium-strontium-titanium oxide, zirconium oxide, hafnium oxide, plumbum-zinc-titanium oxide, strontium-bismuth-tantalum oxide, and any combination thereof.

7. A method of forming a semiconductor device comprising:

forming field regions in a substrate to define a first transistor region, a capacitor region, and a second transistor region;

forming a gate pattern in the first transistor region and a lower electrode in the capacitor region;

forming an upper electrode with a dielectric layer interposed between the upper electrode and the lower electrode and a second gate stack in the second transistor region; and patterning the gate pattern to form a first gate stack in the first transistor region.

8. The method of claim 7, wherein forming the gate pattern and the lower electrode comprises:

forming a first insulation layer and a first conductive layer on the substrate; and patterning the first conductive layer and the first insulation layer to form the first gate pattern and the lower electrode, and wherein forming the upper electrode with the dielectric layer interposed thereunder and the second gate stack comprises:

forming a dielectric layer on the lower electrode;

forming a second insulation layer and a second conductive layer; and patterning the second conductive layer and the second insulation layer to form the upper electrode and the second gate stack.

9. The method of claim 8, wherein the first insulation layer and the second insulation layer are formed having a different thickness from each other.

10. The method of claim 7, wherein forming the gate pattern and the lower electrode comprises:

forming a first insulation layer, a first conductive layer and a dielectric layer on the substrate; and patterning the dielectric layer, the first conductive layer and the first insulation layer to form the gate pattern, the lower electrode and the dielectric layer, and wherein said step of forming the upper electrode and the second gate stack comprises:

forming a second insulation layer and a second conductive layer on the substrate; and patterning the second conductive layer and the second insulation layer to form the upper electrode and the second gate stack.

11. The method of claim 10, wherein the first insulation layer and the second insulation layer are formed having a different thickness from each other.

12. The method of claim 7, wherein edges of the gate pattern formed in the first transistor region overlap the field regions.

13. The method of claim 7, wherein the dielectric layer is a material selected from the group consisting of silicon oxide, silicon nitride, oxide-nitride-oxide, tantalum oxide, barium-strontium-titanium oxide, zirconium oxide, hafnium oxide, plumbum-zinc-titanium oxide, strontium-bismuth-tantalum oxide, and any combination thereof.

* * * * *